(12) United States Patent
Nomoto et al.

(10) Patent No.: US 11,901,231 B2
(45) Date of Patent: Feb. 13, 2024

(54) SEPARATION METHOD OF WAFER

(71) Applicant: DISCO CORPORATION, Tokyo (JP)

(72) Inventors: Asahi Nomoto, Tokyo (JP); Kazuya Hirata, Tokyo (JP)

(73) Assignee: DISCO CORPORATION, Tokyo (JP)

(*) Notice: Subject to any disclaimer, the term of this patent is extended or adjusted under 35 U.S.C. 154(b) by 276 days.

(21) Appl. No.: 17/446,495

(22) Filed: Aug. 31, 2021

(65) Prior Publication Data

US 2022/0102213 A1 Mar. 31, 2022

(30) Foreign Application Priority Data

Sep. 25, 2020 (JP) ................................. 2020-160683

(51) Int. Cl.
| | |
|---|---|
| *H01L 21/77* | (2017.01) |
| *H01L 21/04* | (2006.01) |
| *B23K 26/06* | (2014.01) |
| *B23K 26/00* | (2014.01) |
| *B23K 26/53* | (2014.01) |
| *B23K 103/00* | (2006.01) |

(52) U.S. Cl.
CPC .......... *H01L 21/77* (2013.01); *B23K 26/0093* (2013.01); *B23K 26/0665* (2013.01); *B23K 26/53* (2015.10); *H01L 21/0475* (2013.01); *B23K 2103/56* (2018.08)

(58) Field of Classification Search
CPC ...... H01L 21/77; H01L 21/78; H01L 21/0475
See application file for complete search history.

(56) References Cited

U.S. PATENT DOCUMENTS

| | | | |
|---|---|---|---|
| 7,525,471 B2 * | 4/2009 | Prodi .................... | H03M 1/502 |
| | | | 341/157 |
| 2017/0025276 A1 * | 1/2017 | Hirata .................... | B24B 7/228 |
| 2017/0301549 A1 * | 10/2017 | Suzuki .................. | B24B 37/107 |

FOREIGN PATENT DOCUMENTS

| | | |
|---|---|---|
| JP | 2017028072 A | 2/2017 |
| JP | 2017183503 A | 10/2017 |

* cited by examiner

*Primary Examiner* — Walter H Swanson
(74) *Attorney, Agent, or Firm* — Greer Burns & Crain Ltd.

(57) ABSTRACT

A wafer having a first surface, an opposite second surface, and an outer circumferential surface that includes a curved part curved outward in a protruding manner is separated into two wafers. Part of the wafer is removed along the curved part, and a separation origin is formed inside the wafer by positioning the focal point of a laser beam with a wavelength having transmissibility with respect to the wafer inside the wafer and executing irradiation with the laser beam while the focal point and the wafer are relatively moved in such a manner that the focal point is kept inside the wafer. The wafer is separated into two wafers by an external force.

18 Claims, 10 Drawing Sheets

SEPARATION METHOD OF WAFER

BACKGROUND OF THE INVENTION

Field of the Invention

The present invention relates to a separation method of a wafer.

Description of the Related Art

Chips including a power device such as an inverter or converter are manufactured by dividing a wafer on which a large number of power devices are formed on a front surface into regions each including the individual power device. For example, the wafer is thinned until the thickness thereof becomes a predetermined thickness through grinding of the back surface side by use of a grinding apparatus and thereafter is divided into the individual chips by using a processing apparatus such as a cutting apparatus and a laser processing apparatus.

In recent years, silicon carbide (SiC) has been attracting attention as a next-generation material for the power device. However, the hardness of silicon carbide is very high. For this reason, various problems possibly occur in a case of manufacturing chips including a power device with use of a wafer composed of silicon carbide.

For example, when a wafer composed of silicon carbide is ground by using a grinding apparatus, the amount of wear of a grinding abrasive stone used for the grinding is liable to become large. In this case, the need to frequently replace the grinding abrasive stone arises. Therefore, problems that the manufacturing efficiency of the chips lowers and the manufacturing cost also increases possibly occur.

As a method for thinning a wafer, a method using a laser beam is also known (for example, refer to Japanese Patent Laid-open No. 2017-28072). In this method, the wafer is irradiated with the laser beam, and modified layers and cracks are formed inside the wafer. Thereafter, the wafer is separated with use of the modified layers and the cracks as the separation origin by giving an external force to the wafer.

Further, when a wafer processed in various steps is conveyed, breakage and chipping are liable to occur in the outer circumferential part of the wafer. As a method for preventing such breakage and chipping, a method in which the outer circumferential part of a wafer is chamfered, that is, the outer circumferential part is ground to cause the outer circumferential surface of the wafer to curve outward in a protruding manner (for example, refer to Japanese Patent Laid-open No. 2017-183503) is known.

SUMMARY OF THE INVENTION

In a case of separating a wafer having a chamfered outer circumferential part by using the method disclosed in Japanese Patent Laid-open No. 2017-28072, a laser beam is liable to be diffusely reflected due to recesses and protrusions that exist in the outer circumferential surface. In this case, there is a possibility that the laser beam is not focused on the inside of the outer circumferential part of the wafer and modified layers and cracks that become the separation origin are not formed inside the outer circumferential part.

Further, when the outer circumferential surface curves, there is also a possibility that the position (depth from the front surface of the wafer) of the focal point of the laser beam deviates from an envisaged position. In this case, even if the separation origin is formed inside the outer circumferential part, the separation origin formed in the outer circumferential part is formed at a position (depth from the front surface of the wafer) different from the separation origin formed in the other part.

For this reason, in a case of irradiating the chamfered outer circumferential part of the wafer with a laser beam, there is a possibility that the wafer is not separated or the wafer is separated into two wafers in which the thickness is different between the outer circumferential part and the other part. In view of this point, an object of the present invention is to provide a separation method of a wafer that can stably separate the wafer in which the outer circumferential part is chamfered.

In accordance with an aspect of the present invention, there is provided a separation method of a wafer by which the wafer having a first surface, a second surface on a side opposite to the first surface, and an outer circumferential surface that is located between the first surface and the second surface and that includes a curved part curved outward in a protruding manner is separated into two wafers on a side of the first surface and on a side of the second surface. The separation method includes a processing step of processing the wafer to remove part of the wafer along the curved part, a separation origin forming step of, after the processing step, forming a separation origin inside the wafer by positioning a focal point of a laser beam with a wavelength having transmissibility with respect to the wafer inside the wafer and executing irradiation with the laser beam while the focal point and the wafer are relatively moved in such a manner that the focal point is kept inside the wafer, and a separation step of separating the wafer into a wafer having the first surface and a wafer having the second surface from the separation origin by giving an external force after the separation origin forming step.

Preferably, the curved part has a first part that extends in a circular arc manner and a second part that extends in a straight line manner, and, in the processing step, the wafer is processed in such a manner that part of the wafer is removed in a circular arc manner along the first part and part of the wafer is removed in a straight line manner or a circular arc manner along the second part.

In addition, it is preferable that all of the curved part is removed from the wafer in the processing step.

Alternatively, it is preferable that part of the curved part on the side of the first surface is removed from the side of the first surface of the wafer in the processing step, and, in the separation origin forming step, the focal point is positioned to a depth between the first surface of the wafer and the curved part that remains.

Alternatively, it is preferable that part of the wafer on the side of the first surface is removed from the side of the first surface of the wafer to form a groove in the processing step, and, in the separation origin forming step, the focal point is positioned to a depth between the first surface of the wafer and a bottom surface of the groove, and a region surrounded by the groove of the wafer is irradiated with the laser beam.

Moreover, it is preferable that a cutting blade is made to cut into the wafer to remove the part of the wafer in the processing step.

In the present invention, prior to forming the separation origin inside the wafer, the wafer is processed to remove part of the wafer along the curved part of the outer circumferential surface (chamfered outer circumferential part). This makes it possible to form modified layers and cracks that become the separation origin inside the wafer without causing diffuse reflection of the laser beam and/or deviation of the focal point at the curved part of the outer circumferential surface. As a result, the wafer can be stably separated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
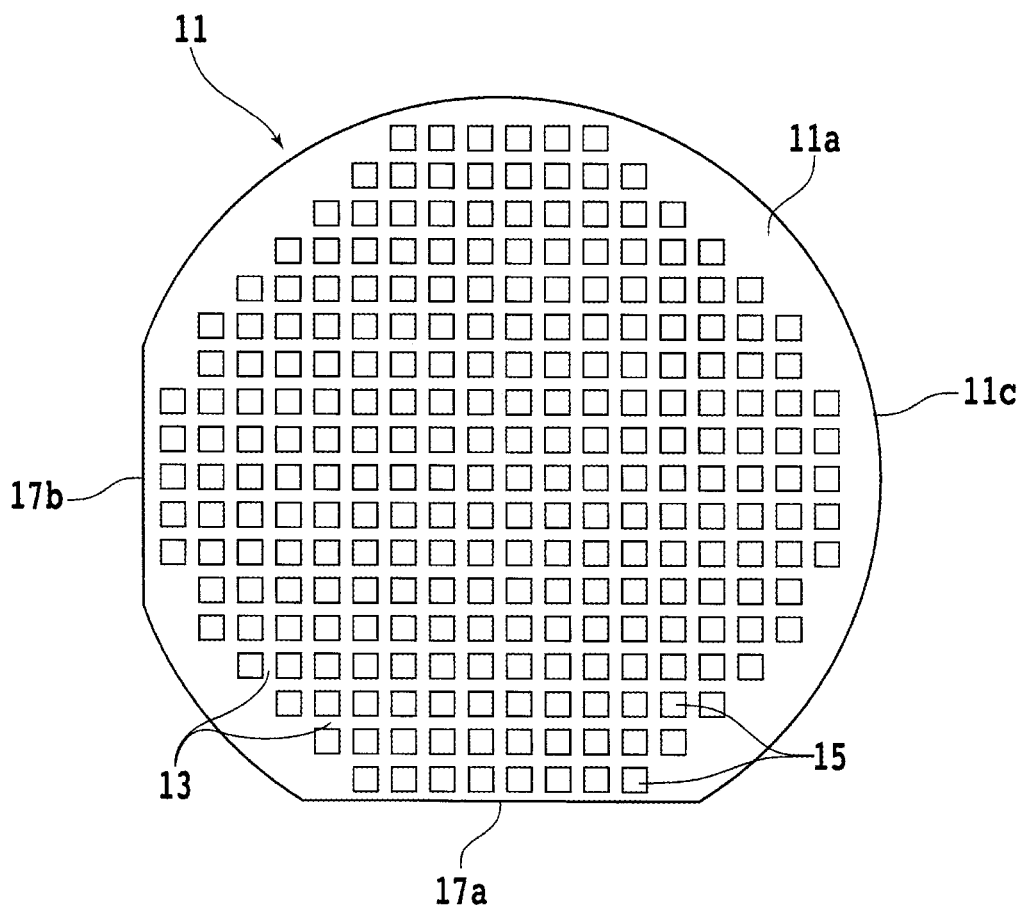
FIG. 1A is a top view schematically illustrating a wafer.
Figure 1B:
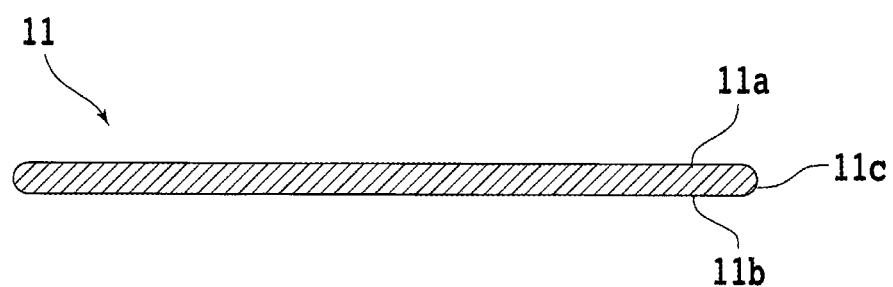
FIG. 1B is a sectional view schematically illustrating the wafer.

An embodiment of the present invention will be described with reference to the accompanying drawings. FIG. 1A and FIG. 1B are top view and sectional view schematically illustrating a wafer to be separated into two wafers. A wafer 11 illustrated in FIG. 1A and FIG. 1B is composed of silicon carbide (SiC), for example.

The wafer 11 has a first surface (front surface) 11a, a second surface (back surface) 11b on the side opposite to the first surface 11a, and an outer circumferential surface 11c located between the first surface 11a and the second surface 11b. Further, the side of the first surface 11a of the wafer 11 is segmented into plural regions by plural planned dividing lines 13 that intersect each other and a device 15 such as an inverter or converter is formed in each region.

In the outer circumferential surface 11c of the wafer 11, two flat parts that represent the crystal orientation, what is generally called a primary orientation flat 17a and a secondary orientation flat 17b are formed. That is, the parts at which the primary orientation flat 17a and the secondary orientation flat 17b are formed in the outer circumferential surface 11c extend in a straight line manner, and the part other than them extends in a circular arc manner.

Further, the outer circumferential part of the wafer 11 is chamfered in such a manner that the outer circumferential surface 11c bends outward in a protruding manner. Due to this, the outer circumferential surface 11c has a curved part formed due to the chamfering. Moreover, this curved part extends in a straight line manner at the parts at which the primary orientation flat 17a and the secondary orientation flat 17b are formed and extends in a circular arc manner at the part other than them.

There is no limit on the material, shape, structure, size, and so forth of the wafer 11. The wafer 11 may be composed of materials such as another semiconductor such as silicon (Si), ceramic, resin, and metal, for example. Further, in the outer circumferential surface 11c of the wafer 11, a V-shaped cut that represents the crystal orientation, what is generally called a notch, may be formed instead of the orientation flat.

Moreover, all of the outer circumferential part of the wafer 11 does not need to be chamfered. For example, a configuration in which the parts at which the primary orientation flat 17a and the secondary orientation flat 17b are formed in the outer circumferential part of the wafer 11 are not chamfered and only the part other than them is chamfered may be employed. In this case, the outer circumferential surface 11c includes a curved part formed due to the chamfering and a non-chamfered part that is not chamfered.

Similarly, there is no limit also on the kind, quantity, shape, structure, size, arrangement, and so forth of the device 15. For example, the device 15 may be an integrated circuit (IC), large scale integration (LSI), or the like. Further, the devices 15 do not need to be formed on the wafer 11.

Figure 2:
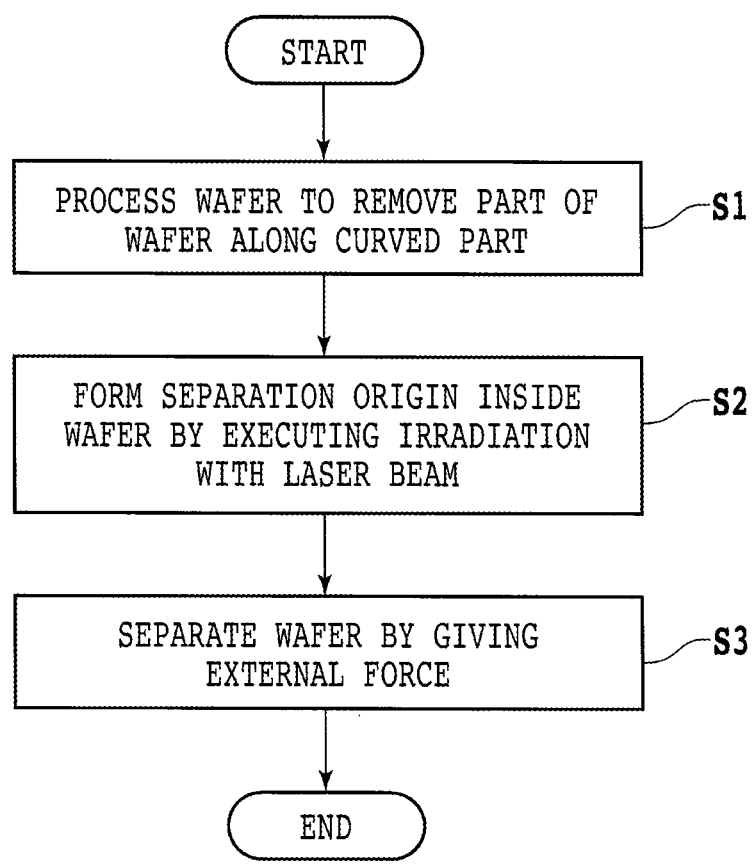
FIG. 2 is a flowchart illustrating one example of a separation method of a wafer.

FIG. 2 is a flowchart illustrating one example of a separation method of a wafer that separates the wafer 11 illustrated in FIG. 1A and FIG. 1B into two wafers on the first surface side and on the second surface side (a wafer having the first surface 11a and another wafer having the second surface 11b). In the separation method of a wafer illustrated in FIG. 2, first, the wafer 11 is processed to remove part of the wafer 11 along the curved part of the outer circumferential surface 11c (processing step: S1).

In the processing step (S1), all of the curved part may be removed from the wafer 11 (full-cutting trim) to planarize the outer circumferential surface of the wafer 11, or part of the curved part on the side of the first surface 11a may be removed from the side of the first surface 11a of the wafer 11 (half-cutting trim) to form a step in the outer circumferential part of the wafer 11. Moreover, in the processing step (S1), part of the wafer 11 on the side of the first surface 11a may be removed from the side of the first surface 11a to form a groove along the curved part of the outer circumferential surface 11c. That is, in the processing step (S1), at least part of the wafer 11 on the side of the first surface 11a is removed along the curved part of the outer circumferential surface 11c.

In the following, with reference to FIG. 3 to FIG. 5, description will be made sequentially about a processing step (S1-1) in which the full-cutting trim of the wafer 11 is executed to planarize the outer circumferential surface of the wafer 11, a processing step (S1-2) in which the half-cutting trim of the wafer 11 is executed to form a step in the outer circumferential part of the wafer 11, and a processing step (S1-3) in which part of the wafer 11 on the side of the first surface 11a is removed to form a groove along the curved part of the outer circumferential surface 11c.

Figure 3:
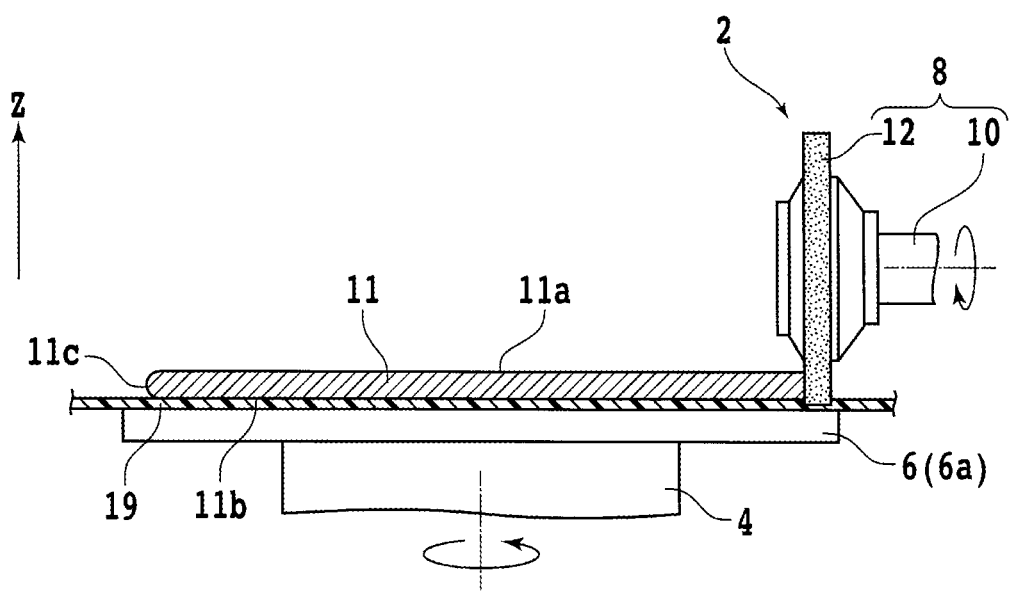
FIG. 3 is a partial sectional side view schematically illustrating a processing step of executing full-cutting trim of the wafer.

FIG. 3 is a partial sectional side view schematically illustrating the processing step (S1-1) in which the full-cutting trim of the wafer 11 is executed to planarize the outer circumferential surface of the wafer 11. Specifically, in the processing step (S1-1) illustrated in FIG. 3, a cutting apparatus 2 cuts and removes all of the curved part from the side of the first surface 11a of the wafer 11 for which a tape 19 is stuck to the second surface 11b. A Z-axis direction illustrated in FIG. 3 is substantially parallel to the vertical direction.

The cutting apparatus 2 has a θ table 4 with a circular column shape. A circular-disc-shaped chuck table 6 over which the wafer 11 is placed with the interposition of the tape 19 is disposed on the θ table 4. Further, the θ table 4 is coupled to a rotational drive source (not illustrated) such as a motor. When the rotational drive source is operated, the θ table 4 and the chuck table 6 rotate with a straight line that passes through the center of the chuck table 6 and is along the Z-axis direction being the axial center.

The chuck table 6 has a frame body 6a formed of a metal such as stainless steel. The frame body 6a has a bottom wall with a circular disc shape and a circular annular sidewall disposed upward from the outer circumferential part of the bottom wall, and a recessed part is defined by the sidewall. Into the recessed part, a circular-disc-shaped porous plate (not illustrated) that is formed of porous ceramic and has substantially the same diameter as the inner diameter of the recessed part is fixed.

The porous plate of the chuck table 6 is coupled to a suction source (not illustrated) such as a vacuum pump through a flow path formed in the frame body 6a. When the suction source is operated, a negative pressure is generated at the upper surface of the porous plate (holding surface of the chuck table 6). Due to the generation of the negative pressure, the wafer 11 placed over the chuck table 6 is sucked and held by the chuck table 6 with the interposition of the tape 19.

Moreover, the θ table 4 and the chuck table 6 are coupled to an X-axis direction movement mechanism (not illustrated). When the X-axis direction movement mechanism is operated, the θ table 4 and the chuck table 6 move in a direction orthogonal to the Z-axis direction (X-axis direction).

A cutting unit 8 is disposed over the chuck table 6. The cutting unit 8 is coupled to a Y-axis direction movement mechanism (not illustrated) and a Z-axis direction movement mechanism (not illustrated). When the Y-axis direction movement mechanism is operated, the cutting unit 8 moves in the direction that is orthogonal to the Z-axis direction and is orthogonal to the X-axis direction (Y-axis direction). Further, when this Z-axis direction movement mechanism is operated, the cutting unit 8 moves in the Z-axis direction, that is, the cutting unit 8 rises and lowers.

The cutting unit 8 has a spindle 10 that extends in the Y-axis direction and has a circular column shape. A cutting blade 12 having a circular annular cutting edge is mounted to one end part of the spindle 10. For example, the cutting blade 12 is a hub-type cutting blade configured through integration of a circular annular base composed of a metal or the like and the circular annular cutting edge along the outer circumferential edge of the base.

The cutting edge of the hub-type cutting blade is configured by an electroformed abrasive stone in which abrasive grains composed of diamond, cubic boron nitride (cBN), or the like are fixed by a binder of nickel or the like. Further, as the cutting blade 12, a washer-type cutting blade configured by a circular annular cutting edge in which abrasive grains are fixed by a binder composed of a metal, ceramic, resin, or the like may be used.

Moreover, the other end part of the spindle is coupled to a rotational drive source (not illustrated) such as a motor. When the rotational drive source is operated, the cutting blade 12 rotates together with the spindle 10 with a straight line that passes through the center of the spindle 10 and is along the Y-axis direction being the axial center.

In the processing step (S1) illustrated in FIG. 3, for example, all of the curved part of the circular-arc-shaped outer circumferential surface 11c of the wafer 11, i.e., the outer circumferential surface 11c at the part other than the parts at which the primary orientation flat 17a and the secondary orientation flat 17b are formed, is removed, and thereafter all of the curved part of the outer circumferential surface 11c at the parts at which the primary orientation flat 17a and the secondary orientation flat 17b are formed is removed.

For example, first, the chuck table 6 and/or the cutting unit 8 is positioned in such a manner that the lower end of the cutting blade 12 is disposed directly above the circular-arc-shaped outer circumferential surface 11c of the wafer 11. Subsequently, the cutting unit 8 is lowered until the cutting blade 12 gets contact with the tape 19 in a state in which the cutting blade 12 rotates.

Subsequently, the chuck table 6 is rotated by at least one turn with the cutting blade 12 kept rotating. All of the curved part of the circular-arc-shaped outer circumferential surface 11c of the wafer 11 is thereby removed. That is, all of the curved part that extends in a circular arm manner is removed in a circular arc manner.

Subsequently, the chuck table 6 is rotated to cause the primary orientation flat 17a or the secondary orientation flat 17b to become parallel to the X-axis direction. Subsequently, the chuck table 6 is moved along the X-axis direction to cause the cutting blade 12 to be separate from the wafer 11. Subsequently, the cutting unit 8 is moved along the Y-axis direction in such a manner that the cutting blade 12 is disposed in the X-axis direction as viewed from the primary orientation flat 17a or the secondary orientation flat 17b.

Subsequently, the cutting unit 8 is lowered to cause the lower end of the cutting blade 12 to become lower than the upper surface of the tape 19 and higher than the lower surface thereof. Subsequently, the chuck table 6 is moved along the X-axis direction in such a manner that the wafer 11 passes through the cutting blade 12 from one end of the cutting blade 12 in the X-axis direction to the other end in the state in which the cutting blade 12 rotates.

As a result, all of the curved part of the outer circumferential surface 11c at the parts at which the primary orientation flat 17a and the secondary orientation flat 17b are formed is removed. That is, all of the curved part that extends in a straight line manner is removed in a straight line manner.

Figure 4:
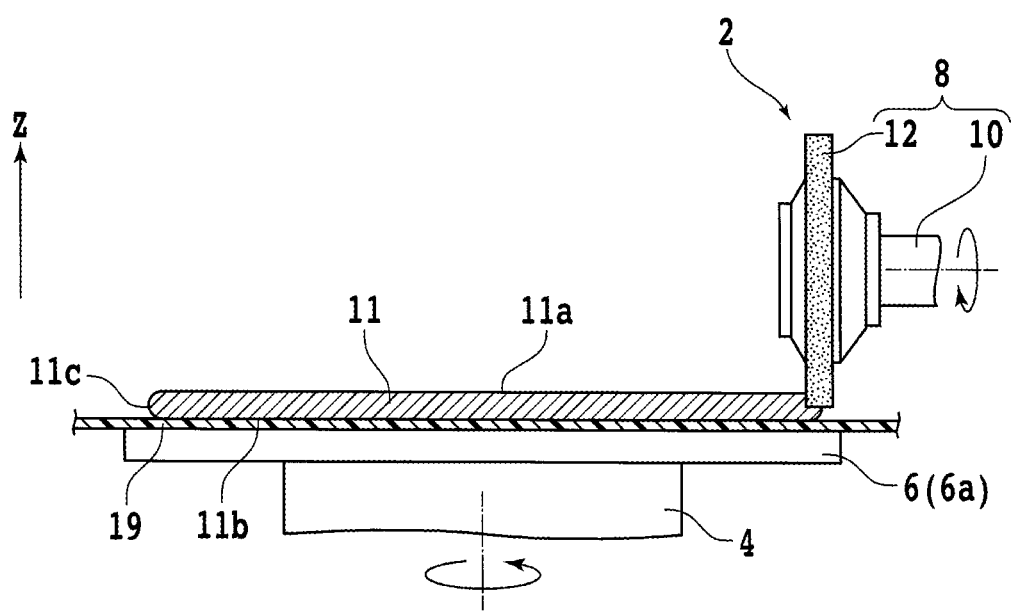
FIG. 4 is a partial sectional side view schematically illustrating the processing step of executing half-cutting trim of the wafer.

FIG. 4 is a partial sectional side view schematically illustrating the processing step (S1-2) in which the half-cutting trim of the wafer 11 is executed to form a step in the outer circumferential part of the wafer 11. The cutting apparatus 2 illustrated in FIG. 4 is the same as the cutting apparatus 2 illustrated in FIG. 3, and therefore description thereof is omitted.

In the processing step (S1-2) illustrated in FIG. 4, for example, part of the curved part on the side of the first surface 11a in the circular-arc-shaped outer circumferential surface 11c of the wafer 11 is removed, and thereafter part of the curved part on the side of the first surface 11a in the outer circumferential surface 11c at the parts at which the primary orientation flat 17a and the secondary orientation flat 17b are formed is removed.

For example, first, the chuck table 6 and/or the cutting unit 8 is positioned in such a manner that the lower end of the cutting blade 12 is disposed directly above the circular-arc-shaped outer circumferential surface 11c of the wafer 11. Subsequently, in the state in which the cutting blade 12 rotates, the cutting unit 8 is lowered until the lower end of the cutting blade 12 reaches a position that is lower than the first surface 11a and is higher than the second surface 11b.

Subsequently, the chuck table 6 is rotated by at least one turn with the cutting blade 12 kept rotating. Part of the curved part on the side of the first surface 11a in the circular-arc-shaped outer circumferential surface 11c of the wafer 11 is thereby removed. That is, part on the side of the first surface 11a in the curved part that extends in a circular arc manner is removed in a circular arc manner.

Subsequently, the chuck table 6 is rotated to cause the primary orientation flat 17a or the secondary orientation flat 17b to become parallel to the X-axis direction. Subsequently, the chuck table 6 is moved along the X-axis direction to cause the cutting blade 12 to be separate from the wafer 11. Subsequently, the cutting unit 8 is moved along the Y-axis direction in such a manner that the cutting blade 12 is disposed in the X-axis direction as viewed from the primary orientation flat 17a or the secondary orientation flat 17b.

Subsequently, the cutting unit 8 is lowered to cause the lower end of the cutting blade 12 to become lower than the first surface 11a and higher than the second surface 11b. Subsequently, the chuck table 6 is moved along the X-axis direction in such a manner that the wafer 11 passes through the cutting blade 12 from one end of the cutting blade 12 in the X-axis direction to the other end in the state in which the cutting blade 12 rotates.

As a result, part of the curved part on the side of the first surface 11a in the outer circumferential surface 11c at the parts at which the primary orientation flat 17a and the secondary orientation flat 17b are formed is removed. That is, part on the side of the first surface 11a in the curved part that extends in a straight line manner is removed in a straight line manner.

Figure 5:
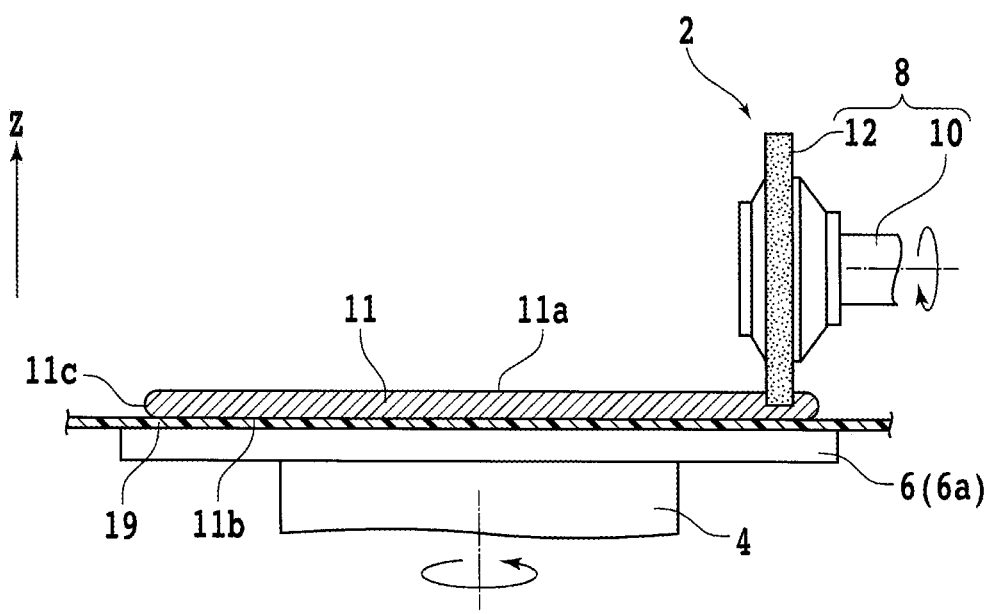
FIG. 5 is a partial sectional side view schematically illustrating the processing step of forming a groove along a curved part in the wafer.

FIG. 5 is a partial sectional side view schematically illustrating the processing step (S1-3) in which part of the wafer 11 on the side of the first surface 11a is removed from the side of the first surface 11a to form a groove along the curved part of the outer circumferential surface 11c. The cutting apparatus 2 illustrated in FIG. 5 is the same as the cutting apparatus 2 illustrated in FIG. 3 and FIG. 4, and therefore description thereof is omitted.

In the processing step (S1-3) illustrated in FIG. 5, for example, a groove that extends in a circular arc manner is formed along the curved part of the circular-arc-shaped outer circumferential surface 11c of the wafer 11, and thereafter a groove that extends in a straight line manner is formed along the curved part of the outer circumferential surface 11c at the parts at which the primary orientation flat 17a and the secondary orientation flat 17b are formed.

For example, first, the chuck table 6 and/or the cutting unit 8 is positioned in such a manner that the lower end of the cutting blade 12 is disposed directly above a region in which the distance from the center of the wafer 11 is shorter than the interval between the circular-arc-shaped outer circumferential surface 11c and the center of the wafer 11 and is longer than the shortest interval between the primary orientation flat 17a and the secondary orientation flat 17b and the center of the wafer 11.

Subsequently, in the state in which the cutting blade 12 rotates, the cutting unit 8 is lowered until the lower end of the cutting blade 12 reaches a position that is lower than the first surface 11a and is higher than the second surface 11b. Subsequently, the chuck table 6 is rotated by at least one turn with the cutting blade 12 kept rotating.

As a result, a groove that extends in a circular arc manner is formed along the curved part of the circular-arc-shaped outer circumferential surface 11c of the wafer 11. That is, part of the wafer 11 on the side of the first surface 11a is removed in a circular arc manner along the curved part that extends in a circular arc manner.

Subsequently, the chuck table 6 is rotated to cause the primary orientation flat 17a or the secondary orientation flat 17b to become parallel to the X-axis direction. Subsequently, the chuck table 6 is moved along the X-axis direction to cause the cutting blade 12 to be separate from the wafer 11. Subsequently, the cutting unit 8 is moved along the Y-axis direction in such a manner that the cutting blade 12 is disposed at a position that slightly deviates to the side of the wafer 11 from the X-axis direction as viewed from the primary orientation flat 17a or the secondary orientation flat 17b.

Subsequently, the cutting unit 8 is lowered to cause the lower end of the cutting blade 12 to become lower than the first surface 11a and higher than the second surface 11b. Subsequently, the chuck table 6 is moved along the X-axis direction in such a manner that the wafer 11 passes through the cutting blade 12 from one end of the cutting blade 12 in the X-axis direction to the other end in the state in which the cutting blade 12 rotates.

As a result, a groove that extends in a straight line manner is formed along the curved part of the outer circumferential surface 11c at the parts at which the primary orientation flat 17a and the secondary orientation flat 17b are formed. That is, part of the wafer 11 on the side of the first surface 11a is removed in a straight line manner along the curved part that extends in a straight line manner.

Alternatively, in the processing step (S1-3) illustrated in FIG. 5, a circular annular groove may be formed through removing part of the wafer 11 on the side of the first surface 11a from the side of the first surface 11a. That is, in the processing step (S1-3) illustrated in FIG. 5, a groove may be formed, the groove extending in a circular arc manner along the curved part of the circular-arc-shaped outer circumferential surface 11c of the wafer 11 and extending in a circular arc manner along the curved part of the outer circumferential surface 11c at the parts at which the primary orientation flat 17a and the secondary orientation flat 17b are formed.

For example, first, the chuck table 6 and/or the cutting unit 8 is positioned in such a manner that the lower end of the cutting blade 12 is disposed directly above a region in which the distance from the center of the wafer 11 is shorter than the shortest interval between the primary orientation flat 17a and the secondary orientation flat 17b and the center of the wafer 11.

Subsequently, in the state in which the cutting blade 12 rotates, the cutting unit 8 is lowered until the lower end of the cutting blade 12 reaches a position that is lower than the first surface 11a and is higher than the second surface 11b. Subsequently, the chuck table 6 is rotated by at least one turn with the cutting blade 12 kept rotating. A circular annular groove is thereby formed on the side of the first surface 11a of the wafer 11.

That is, part of the wafer 11 on the side of the first surface 11a is removed in a circular arc manner along the curved part that extends in a circular arc manner (curved part of the circular-arc-shaped outer circumferential surface 11c). In addition, part of the wafer 11 on the side of the first surface 11a is removed in a circular arc manner along the curved part that extends in a straight line manner (curved part of the outer circumferential surface 11c at the parts at which the primary orientation flat 17a and the secondary orientation flat 17b are formed).

Figure 6A:
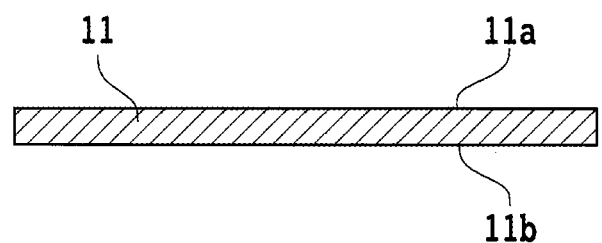
FIG. 6A is a sectional view schematically illustrating the wafer processed in the processing step.
Figure 6B:
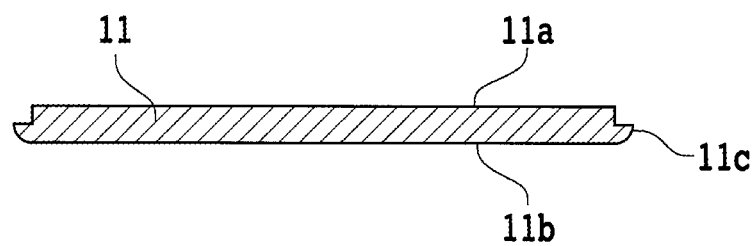
FIG. 6B is another sectional view schematically illustrating the wafer processed in the processing step.
Figure 6C:
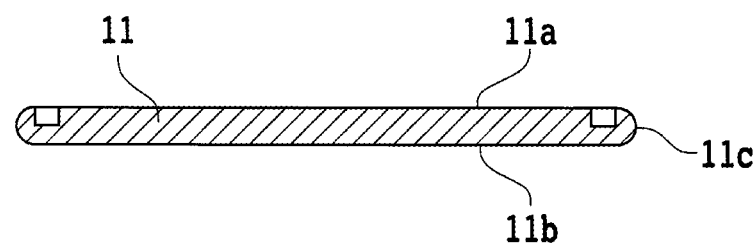
FIG. 6C is still another sectional view schematically illustrating the wafer processed in the processing step.

FIG. 6A, FIG. 6B, and FIG. 6C are each a sectional view schematically illustrating the wafer 11 processed to remove part of the wafer 11 along the curved part of the outer circumferential surface 11c in the processing step (S1).

Specifically, FIG. 6A is a sectional view illustrating the wafer 11 in which the outer circumferential surface has been planarized in the processing step (S1-1). Further, FIG. 6B is a sectional view illustrating the wafer 11 in which a step has been formed in the outer circumferential part in the processing step (S1-2). Moreover, FIG. 6C is a sectional view illustrating the wafer 11 in which a groove along the curved part of the outer circumferential surface 11c has been formed in the processing step (S1-3).

In the separation method of a wafer illustrated in FIG. 2, after the processing step (S1), a separation origin is formed inside the wafer 11 by irradiating the wafer 11 with a laser beam (separation origin forming step: S2).

In the following, with reference to FIG. 7 to FIG. 9, description will be made sequentially about a separation origin forming step (S2-1) of forming a separation origin inside the wafer 11 in which the outer circumferential surface has been planarized, a separation origin forming step (S2-2) of forming a separation origin inside the wafer 11 in which a step has been formed in the outer circumferential part, and a separation origin forming step (S2-3) of forming a separation origin inside the wafer 11 in which a groove along the curved part of the outer circumferential surface 11c has been formed.

Figure 7:
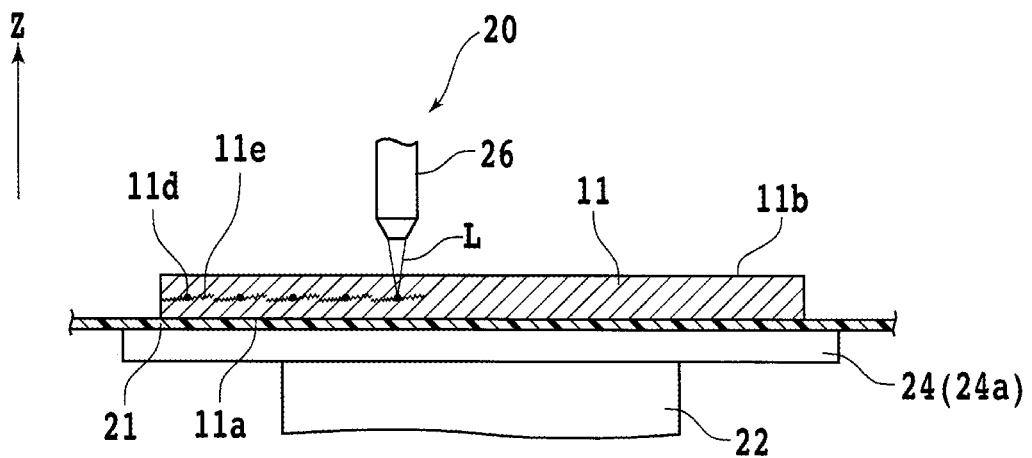
FIG. 7 is a partial sectional side view schematically illustrating a separation origin forming step of forming a separation origin in the wafer for which the full-cutting trim has been executed.

FIG. 7 is a partial sectional side view schematically illustrating the separation origin forming step (S2-1) of forming a separation origin inside the wafer 11 in which the outer circumferential surface has been planarized in the processing step (S1-1). Specifically, in the separation origin forming step (S2-1) illustrated in FIG. 7, a laser beam irradiation apparatus 20 irradiates the wafer 11 with a laser beam from the side of the second surface 11b of the wafer 11 for which a tape 21 is stuck to the first surface 11a to form the separation origin inside the wafer 11. A Z-axis direction illustrated in FIG. 7 is substantially parallel to the vertical direction.

The laser beam irradiation apparatus 20 has a table base 22 with a circular column shape. A circular-disc-shaped chuck table 24 over which the wafer 11 is placed with the interposition of the tape 21 is disposed on the table base 22.

The chuck table 24 has a frame body 24a formed of a metal such as stainless steel. The frame body 24a has a bottom wall with a circular disc shape and a circular annular sidewall disposed upward from the outer circumferential part of the bottom wall, and a recessed part is defined by the sidewall. Into the recessed part, a circular-disc-shaped porous plate (not illustrated) that is formed of porous ceramic and has substantially the same diameter as the inner diameter of the recessed part is fixed.

The porous plate of the chuck table 24 is coupled to a suction source (not illustrated) such as a vacuum pump through a flow path formed in the frame body 24a. When the suction source is operated, a negative pressure is generated at the upper surface of the porous plate (holding surface of the chuck table 24). Due to the generation of the negative pressure, the wafer 11 placed over the chuck table 24 is sucked and held by the chuck table 24 with the interposition of the tape 21.

Moreover, the table base 22 and the chuck table 24 are coupled to a horizontal direction movement mechanism (not illustrated). When the horizontal direction movement mechanism is operated, the table base 22 and the chuck table 24 move in the plane orthogonal to the Z-axis direction (horizontal plane).

A head 26 of a laser beam irradiation unit (not illustrated) is disposed over the chuck table 24. The head 26 is coupled to a Z-axis direction movement mechanism (not illustrated). When the Z-axis direction movement mechanism is operated, the head 26 moves in the Z-axis direction, that is, the head 26 rises and lowers.

The laser beam irradiation unit has a laser oscillator that generates a laser beam L with a wavelength having transmissibility with respect to the wafer 11. The laser oscillator has a laser medium such as Nd:YAG suitable for laser oscillation, for example. Further, the laser beam irradiation unit has an optical system including a collecting lens that positions the focal point of the laser beam L to a predetermined height, and so forth. In addition, the collecting lens is housed in the head 26.

In the separation origin forming step (S2-1) illustrated in FIG. 7, the height of the optical system of the laser beam irradiation unit, for example, the head 26, is set in such a manner that the focal point of the laser beam L is positioned inside the wafer 11. Thereafter, irradiation with the laser beam L is executed while the chuck table 24 is moved in the horizontal plane. Modified layers 11d and cracks 11e that become the separation origin are thereby formed inside the wafer 11.

Figure 8:
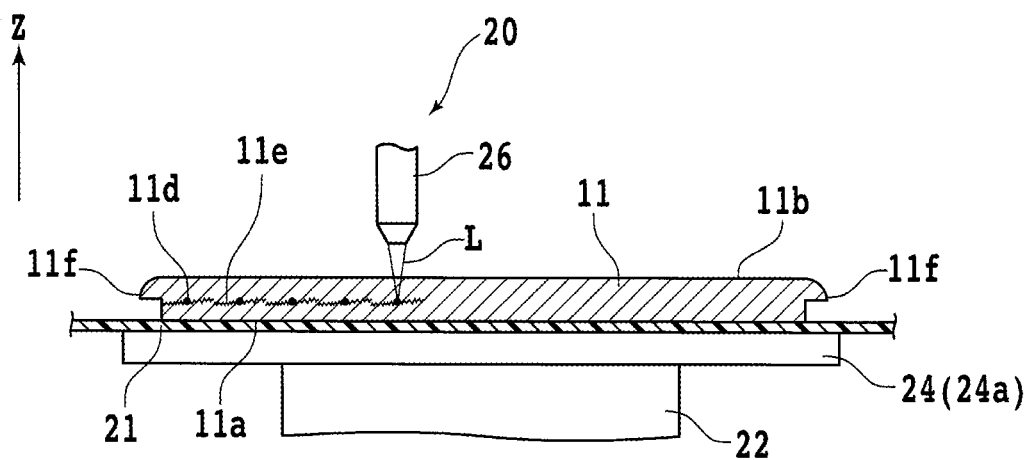
FIG. 8 is a partial sectional side view schematically illustrating a separation origin forming step of forming the separation origin in the wafer for which the half-cutting trim has been executed.

FIG. 8 is a partial sectional side view schematically illustrating the separation origin forming step (S2-2) of forming a separation origin inside the wafer 11 in which a step has been formed in the outer circumferential part in the processing step (S1-2). The laser beam irradiation apparatus 20 illustrated in FIG. 8 is the same as the laser beam irradiation apparatus 20 illustrated in FIG. 7, and therefore description thereof is omitted.

In the separation origin forming step (S2-2) illustrated in FIG. 8, the height of the optical system of the laser beam irradiation unit, for example, the head 26, is set in such a manner that the focal point of the laser beam L is positioned to a depth between the first surface 11a of the wafer 11 and a curved part 11f that remains. Thereafter, irradiation with the laser beam L is executed while the chuck table 24 is moved in the horizontal plane.

Specifically, in the separation origin forming step (S2-2) illustrated in FIG. 8, the optical system is so set as to position the focal point of the laser beam L between a first virtual plane that passes through the place closest to the first surface 11a in the step formed in the outer circumferential part and that is substantially parallel to the first surface 11a and the second surface 11b and a second virtual plane that passes through the place closest to the second surface 11b in this step and that is substantially parallel to the first surface 11a and the second surface 11b.

Due to this, the modified layers 11d and the cracks 11e that become the separation origin are formed at the depth between the first surface 11a of the wafer 11 and the curved part 11f that remains (that is, between the first virtual plane and the second virtual plane).

Figure 9:
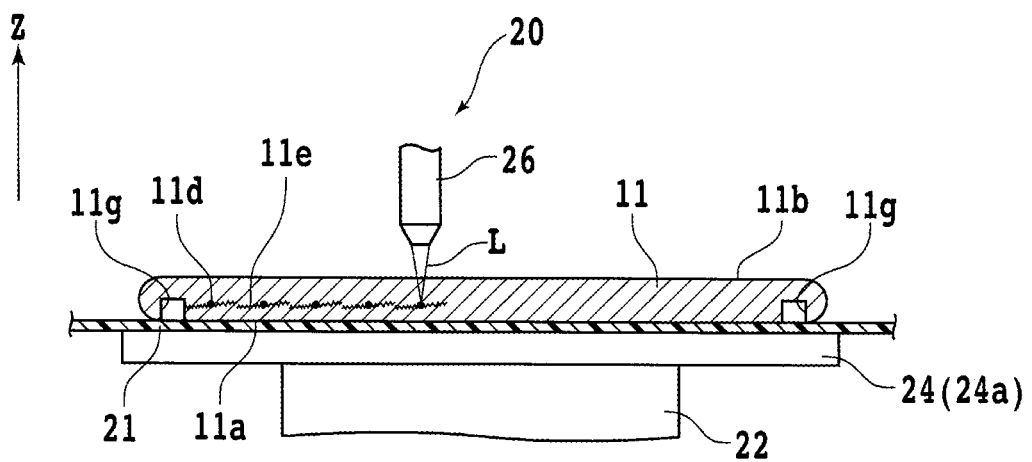
FIG. 9 is a partial sectional side view schematically illustrating a separation origin forming step of forming the separation origin in the wafer in which the groove along the curved part has been formed.

FIG. 9 is a partial sectional side view schematically illustrating the separation origin forming step (S2-3) of forming a separation origin inside the wafer 11 in which a groove 11g along the curved part of the outer circumferential surface 11c has been formed in the processing step (S1-3). The laser beam irradiation apparatus 20 illustrated in FIG. 9 is the same as the laser beam irradiation apparatus 20 illustrated in FIG. 7 and FIG. 8, and therefore description thereof is omitted.

In the separation origin forming step (S2-3) illustrated in FIG. 9, the height of the optical system of the laser beam irradiation unit, for example, the head 26, is set in such a manner that the focal point of the laser beam L is positioned to a depth between the first surface 11a of the wafer 11 and the bottom surface of the groove 11g. Thereafter, irradiation with the laser beam L is executed while the chuck table 24 is moved in the horizontal plane in such a manner that the focal point is kept in the region surrounded by the groove 11g of the wafer 11.

Specifically, in the separation origin forming step (S2-3) illustrated in FIG. 9, the optical system is so set as to position the focal point of the laser beam L between a third virtual plane that passes through the place closest to the first surface 11a in the groove 11g and that is substantially parallel to the first surface 11a and the second surface 11b and a fourth virtual plane that passes through the place closest to the second surface 11b in the groove 11g and that is substantially parallel to the first surface 11a and the second surface 11b.

Due to this, the modified layers 11d and the cracks 11e that become the separation origin are formed at the depth between the first surface 11a of the wafer 11 and the bottom surface of the groove 11g (that is, between the third virtual plane and the fourth virtual plane).

In the separation method of a wafer illustrated in FIG. 2, after the separation origin forming step (S2), the wafer 11 is separated into two wafers on the first surface side and on the second surface side (the wafer having the first surface 11a and the wafer having the second surface 11b) by giving an external force (separation step: S3).

Figure 10:
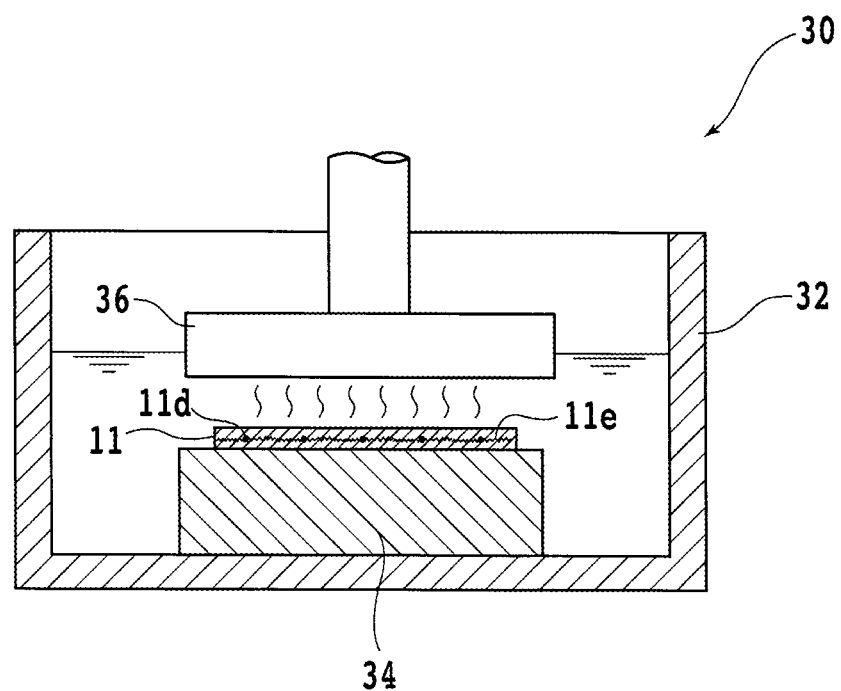
FIG. 10 is a partial sectional side view schematically illustrating a separation step of separating the wafer.

FIG. 10 is a partial sectional side view schematically illustrating the separation step (S3) of separating the wafer 11 in which the modified layers 11d and the cracks 11e that become the separation origin have been formed in the separation origin forming step (S2). Specifically, in the separation step (S3) illustrated in FIG. 10, an external force is given to the wafer 11 by using an ultrasonic irradiation apparatus 30, and the wafer 11 is separated into two wafers.

The ultrasonic irradiation apparatus 30 has a liquid tank 32 that houses a liquid such as wafer. A circular-disc-shaped placement table 34 on which the wafer 11 is placed is disposed on the bottom surface of the liquid tank 32. Moreover, the ultrasonic irradiation apparatus 30 has an ultrasonic irradiation unit 36 that irradiates the liquid housed in the liquid tank 32 with ultrasonic waves.

In the separation step (S3) illustrated in FIG. 10, for example, the ultrasonic irradiation unit 36 irradiates the liquid housed in the liquid tank 32 with ultrasonic waves and thereby an external force is given to the wafer 11 placed on the placement table 34. Due to this, the wafer 11 is separated into two wafers with a plane including the separation origin of the modified layers 11d and the cracks 11e being the separation plane.

In the separation method of a wafer according to the present embodiment, prior to forming the separation origin inside the wafer 11, the wafer 11 is processed to remove part of the wafer 11 along the curved part of the outer circumferential surface 11c (chamfered outer circumferential part).

This makes it possible to form the modified layers and the cracks that become the separation origin inside the wafer 11 without causing diffuse reflection of the laser beam and/or deviation of the focal point at the curved part of the outer circumferential surface 11c. As a result, the wafer 11 can be stably separated.

The separation method of a wafer according to the above-described embodiment is merely one aspect of the present invention, and a separation method of a wafer having characteristics different from those of the above-described separation method of a wafer is also included in the present invention.

For example, in the above-described processing step (S1), the cutting blade 12 is made to cut into the wafer 11, and part of the wafer 11 is removed. However, the method for removing part of the wafer 11 is not limited thereto.

Specifically, in the processing step (S1), part of the wafer 11 may be removed by executing irradiation with a laser beam with such a wavelength as to be absorbed by the wafer 11 and causing laser ablation.

Further, in the above-described separation origin forming step (S2), the wafer 11 is irradiated with the laser beam from the side of the second surface 11b. However, the wafer 11 may be irradiated with the laser beam from the side of the first surface 11a.

This way is preferable in that the separation origin forming step (S2) can be executed without separating the tape 19 stuck to the second surface 11b in the processing step (S1) and without newly sticking the tape 21 to the first surface 11a. On the other hand, the case in which the wafer 11 is irradiated with the laser beam from the side of the second surface 11b is preferable in that influence on the devices 15 due to the irradiation with the laser beam can be reduced.

Moreover, in the above-described separation origin forming step (S2), the wafer 11 is irradiated with the laser beam L while the chuck table 24 is moved in the horizontal direction. However, the wafer 11 may be irradiated with the laser beam L while the head 26 is moved in the horizontal direction. Alternatively, the wafer 11 may be irradiated with the laser beam L while both the chuck table 24 and the head 26 are moved.

Further, in the above-described separation step (S3), an external force is given to the wafer 11 by using the ultrasonic irradiation apparatus 30 to separate the wafer 11 into two wafers. However, the method for giving an external force to the wafer 11 is not limited to the method of using ultrasonic waves. For example, a tensile stress in the direction orthogonal to the first surface 11a and the second surface 11b may be given to the wafer 11 to separate the wafer 11 into two wafers.

Besides, structures, methods, and so forth according to the above-described embodiment and modification examples can be carried out with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A separation method of a wafer by which the wafer having a first surface, a second surface on a side opposite to the first surface, and an outer circumferential surface that is located between the first surface and the second surface and that includes a curved part curved outward in a protruding manner is separated into two wafers, the separation method comprising:

a processing step of processing the wafer to remove part of the wafer along the curved part, wherein the entire outer circumferential surface is at least partially planarized between the first surface and the second surface in the processing step;

a separation origin forming step of, after the processing step, forming the separation origin inside the wafer by positioning a focal point of a laser beam with a wavelength having transmissibility with respect to the wafer inside the wafer and executing irradiation with the laser beam while the focal point and the wafer are relatively moved in such a manner that the focal point is kept inside the wafer; and a separation step of separating the wafer into a first wafer having the first surface and a second wafer having the second surface from the separation origin by giving an external force after the separation origin forming step.

2. The separation method of the wafer according to claim 1, wherein:

a cutting blade is made to cut into the wafer to remove the part of the wafer in the processing step.

3. The separation method of the wafer according to claim 1, wherein the separation origin extends to the at least partially planarized outer circumferential surface.

4. The separation method of the wafer according to claim 1, wherein:

during the separation step, an external force is given to the wafer by using an ultrasonic irradiation apparatus, the ultrasonic irradiation apparatus including a liquid tank that houses a liquid, and wherein the wafer is placed on a circular-disc shaped placement table within the liquid tank, and the ultrasonic irradiation apparatus has an ultrasonic irradiation unit that irradiates the liquid housed in the liquid tank with ultrasonic waves.

5. The separation method of the wafer according to claim 1, wherein the wafer is flipped between the processing step and the separation origin forming step.

6. The separation method of the wafer according to claim 1, wherein:

all of the curved part is removed from the wafer in the processing step.

7. The separation method of the wafer according to claim 6, wherein:

a cutting blade is made to cut into the wafer to remove the part of the wafer in the processing step.

8. The separation method of the wafer according to claim 1, wherein:

part of the curved part on the side of the first surface is removed from the side of the first surface of the wafer in the processing step, and, in the separation origin forming step, the focal point is positioned to a depth between the first surface of the wafer and a curved part that remains.

9. The separation method of the wafer according to claim 8, wherein:

a cutting blade is made to cut into the wafer to remove the part of the wafer in the processing step.

10. The separation method of the wafer according to claim 1, wherein:

the curved part has a first part that extends in a circular arc manner and a second part that extends in a straight line manner, and, in the processing step, the wafer is processed in such a manner that the part of the wafer that is removed in a circular arc manner along the first part and the part of the wafer that is removed in a straight line manner or the circular arc manner along the second part.

11. The separation method of the wafer according to claim 10, wherein:

all of the curved part is removed from the wafer in the processing step.

12. The separation method of the wafer according to claim 11, wherein:

a cutting blade is made to cut into the wafer to remove the part of the wafer in the processing step.

13. The separation method of the wafer according to claim 10, wherein:

part of the curved part on the side of the first surface is removed from the side of the first surface of the wafer in the processing step, and, in the separation origin forming step, the focal point is positioned to a depth between the first surface of the wafer and a curved part that remains.

14. The separation method of the wafer according to claim 13, wherein:

a cutting blade is made to cut into the wafer to remove the part of the wafer in the processing step.

15. The separation method of the wafer according to claim 10, wherein:

a cutting blade is made to cut into the wafer to remove the part of the wafer in the processing step.

16. A separation method of a wafer by which the wafer having a first surface, a second surface on a side opposite to the first surface, and an outer circumferential surface that is located between the first surface and the second surface and that includes a curved part curved outward in a protruding manner is separated into two wafers, the separation method comprising:

a processing step of processing the wafer to remove part of the wafer along the curved part to form a groove that extends in a straight line manner along a portion of the curved part which extends in a straight line manner;

a separation origin forming step of, after the processing step, forming the separation origin inside the wafer by positioning a focal point of a laser beam with a wavelength having transmissibility with respect to the wafer inside the wafer and executing irradiation with the laser beam while the focal point and the wafer are relatively moved in such a manner that the focal point is kept inside the wafer; and a separation step of separating the wafer into a first wafer having the first surface and a second wafer having the second surface from the separation origin by giving an external force after the separation origin forming step.

17. A separation method of a wafer by which the wafer having a first surface, a second surface on a side opposite to the first surface, and an outer circumferential surface that is located between the first surface and the second surface and that includes a curved part curved outward in a protruding manner is separated into two wafers, the separation method comprising:

a processing step of processing the wafer to remove part of the wafer along the curved part to form a groove in the first surface;

a separation origin forming step of, after the groove has been formed in the processing step, forming the separation origin inside the wafer by positioning a focal point of a laser beam with a wavelength having transmissibility with respect to the wafer inside the wafer and executing irradiation with the laser beam while the focal point and the wafer are relatively moved in such a manner that the focal point is kept inside the wafer, wherein the focal point is positioned to a depth between the first surface of the wafer and a bottom surface of the groove, and a region surrounded by the groove of the wafer is irradiated with the laser beam; and a separation step of separating the wafer into a first wafer having the first surface and a second wafer having the second surface from the separation origin by giving an external force after the separation origin forming step.

18. The separation method of the wafer according to claim 17, wherein at least a portion of the groove extends in a straight line manner along a portion of the curved part which extends in a straight line manner.

* * * * *